(12) United States Patent
Wirths et al.

(10) Patent No.: US 11,967,616 B2
(45) Date of Patent: Apr. 23, 2024

(54) VERTICAL SILICON CARBIDE POWER MOSFET AND IGBT AND A METHOD OF MANUFACTURING THE SAME

(71) Applicant: Hitachi Energy Ltd, Zürich (CH)

(72) Inventors: Stephan Wirths, Thalwil (CH); Andrei Mihaila, Rieden (CH); Lars Knoll, Hägglingen (CH)

(73) Assignee: Hitachi Energy Ltd, Zurich (CH)

( * ) Notice: Subject to any disclaimer, the term of this patent is extended or adjusted under 35 U.S.C. 154(b) by 446 days.

(21) Appl. No.: 17/311,392

(22) PCT Filed: Oct. 22, 2019

(86) PCT No.: PCT/EP2019/078725
§ 371 (c)(1),
(2) Date: Jun. 7, 2021

(87) PCT Pub. No.: WO2020/114666
PCT Pub. Date: Jun. 11, 2020

(65) Prior Publication Data
US 2022/0028976 A1    Jan. 27, 2022

(30) Foreign Application Priority Data
Dec. 7, 2018    (EP) ...................... 18211114

(51) Int. Cl.
*H01L 29/00* (2006.01)
*H01L 29/10* (2006.01)
(Continued)

(52) U.S. Cl.
CPC ...... *H01L 29/1608* (2013.01); *H01L 29/1054* (2013.01); *H01L 29/66068* (2013.01);
(Continued)

(58) Field of Classification Search
CPC .............. H01L 29/1608; H01L 29/1054; H01L 29/66068; H01L 29/7395; H01L 29/7802; H01L 29/66333
See application file for complete search history.

(56) References Cited

U.S. PATENT DOCUMENTS 5,915,194 A    6/1999   Powell et al.
6,482,704 B1   11/2002  Amano et al.
(Continued)

FOREIGN PATENT DOCUMENTS

CN    101419981 A    4/2009
EP    2083448 A1     7/2009
(Continued)

OTHER PUBLICATIONS

Uchida, H. et al., "High Temperature Performance of 3C-SiC MOSFETs with High Channel Mobility", Materials Science Forum, ISSN: 1662-9752, vols. 717-720, Trans Tech Publications, Switzerland, May 14, 2012, total 5 pages.
(Continued)

*Primary Examiner* — Reema Patel
(74) *Attorney, Agent, or Firm* — Slater Matsil, LLP

(57) ABSTRACT

Disclosed is a vertical silicon carbide power MOSFET with a 4H-SiC substrate of n+-type as drain and a 4H-SiC epilayer of n--type, epitaxially grown on the 4H-SiC substrate acting as drift region and a source region of p++-type, a well region of p-type, a channel region of p-type and a contact region of n++-type implanted into the drift region and a metal gate insulated from the source and drift region by a gate-oxide. A high mobility layer with a vertical thickness in a range 0.1 nm to 50 nm exemplarily in the range of 0.5 nm to 10 nm is provided at the interface between the 4H-SiC epilayer and the gate-oxide.

20 Claims, 5 Drawing Sheets

(51) Int. Cl.
  *H01L 29/16* (2006.01)
  *H01L 29/66* (2006.01)
  *H01L 29/739* (2006.01)
  *H01L 29/78* (2006.01)
(52) U.S. Cl.
  CPC .... *H01L 29/66333* (2013.01); *H01L 29/7395* (2013.01); *H01L 29/7802* (2013.01)

(56) References Cited

U.S. PATENT DOCUMENTS

| | | |
|---|---|---|
| 6,763,699 B1 | 7/2004 | Hunter et al. |
| 2008/0296771 A1 | 12/2008 | Das et al. |
| 2014/0084303 A1 | 3/2014 | Shimizu et al. |
| 2017/0077238 A1 | 3/2017 | Kono et al. |
| 2017/0104072 A1 | 4/2017 | Shimizu et al. |

FOREIGN PATENT DOCUMENTS

| | | |
|---|---|---|
| GB | 2538768 A | 11/2016 |
| JP | H10308510 A | 11/1998 |
| JP | 2001144292 A | 5/2001 |
| JP | 2001210637 A | 8/2001 |
| JP | 2003158267 A | 5/2003 |
| JP | 2010529646 A | 8/2010 |
| JP | 2014042064 A | 3/2014 |
| JP | 2014067927 A | 4/2014 |
| JP | 2016018860 A | 2/2016 |
| JP | 2017059600 A | 3/2017 |
| WO | 2016189308 A1 | 12/2016 |

OTHER PUBLICATIONS

Powell, J. Anthony, et al., "Growth of step-free surfaces on device-size (0001) SiC mesas", Applied Physics Letters, vol. 77, No. 10, Sep. 4, 2000, total 4 pages.

VERTICAL SILICON CARBIDE POWER MOSFET AND IGBT AND A METHOD OF MANUFACTURING THE SAME

CROSS-REFERENCE TO RELATED APPLICATIONS

This application is a national stage application of International Application No. PCT/EP2019/078725, filed on Oct. 22, 2019, which claims priority to European Patent Application No. 18211114.6, filed on Dec. 7, 2018, which application is hereby incorporated herein by reference.

A new vertical silicon carbide (SiC) power MOSFET and IGBT and a Method of manufacturing the same is proposed.

The new concept combines the advantages of different SiC polytypes to create a metal-semiconductor-oxide (MOS) interface with low density of interface defect states and, thus, improved MOSFET channel mobility.

BACKGROUND

U.S. Pat. No. 5,915,194 A1 discloses a method of growing atomically-flat surfaces and high-quality low-defect crystal films of polytypic compounds heteroepitaxially on polytypic compound substrates that are different than the crystal film. The method is particularly suited for the growth of 3C-SiC, 2H-AlN, and 2H-GaN on 6H-SiC.

U.S. Pat. No. 6,763,699 A1 discloses gas sensor devices having an atomically flat silicon carbide top surface that, in turn, provides for a uniform, and reproducible surface thereof.

EP 2 083 448 A1 discloses a silicon carbide semiconductor device and a method of manufacturing the same are obtained. A coating film made of Si is formed on an initial growth layer on a 4H-SiC substrate, and an extended terrace surface is formed in a region covered with the coating film. Next, the coating film is removed, and a new growth layer is epitaxially grown on the initial growth layer. A 3C-SiC portion made of 3C-SiC crystals having a polytype stable at a low temperature is grown on the extended terrace surface of the initial growth layer. A channel region of a MOSFET is provided in the 3C-SiC portion having a narrow band gap. As a result, the channel mobility is improved because of a reduction in an interface state.

US 2017/0104072 A1 discloses a semiconductor device including a SiC semiconductor layer, a gate electrode, a gate insulating film provided between the SiC semiconductor layer and the gate electrode, and a region that is provided between the SiC semiconductor layer and the gate insulating film and includes at least one element selected from the group consisting of antimony (Sb), scandium (Sc), yttrium (Y), lanthanum (La), and lanthanoids (Ce, Pr, Nd, Pm, Sm, Eu, Gd, Tb, Dy, Ho, Er, Tm, Yb, and Lu). The concentration of the at least one element is equal to or greater than 1×1019 cm-3 and equal to or less than 2.4×1022 cm-3.

US 2014/0084303 A1 discloses a semiconductor device including a structural body, an insulating film, and a control electrode. The structural body has a first surface, and includes a first semiconductor region including silicon carbide of a first conductivity type, a second semiconductor region including silicon carbide of a second conductivity type, and a third semiconductor region including silicon carbide of the first conductivity type. The structural body has a portion in which the first semiconductor region, the second semiconductor region, and the third semiconductor region are arranged in this order in a first direction along the first surface. The insulating film is provided on the first surface of the structural body. The control electrode is provided on the insulating film. The structural body has a buried region provided between the second semiconductor region and the first surface. The buried region is doped with a group V element.

US 2008/029771 A1 discloses a silicon carbide power device fabricated by forming a p-type silicon carbide epitaxial layer on an n-type silicon carbide substrate, and forming a silicon carbide power device structure on the p-type silicon carbide epitaxial layer. The n-type silicon carbide substrate is at least partially removed, so as to expose the p-type silicon carbide epitaxial layer. An ohmic contact is formed on at least some of the p-type silicon carbide epitaxial layer that is exposed. By at least partially removing the n-type silicon carbide substrate and forming an ohmic contact on the p-type silicon carbide epitaxial layer, the disadvantages of using a p-type substrate may be reduced or eliminated. Related structures are also described.

Problems to be Solved

4H-SiC is the preferred polytype for power electronics, i.e. SiC power MOSFETs, due to the advances in 4H-SiC growth technology as well as its attractive electronic properties such as larger band gap and higher carrier mobility over other available wafer-scale polytypes, e.g. 6H-SiC or 3C-SiC. Although those SiC power MOSFETs are already commercially available, there is large room for improvements, especially regarding inversion channel mobility in order to further decrease on-resistance, $R_{on}$:

$$R_{on} = \frac{4V_B^2}{\varepsilon_s \mu E_c^3}$$

Whereas, for higher voltage classes >3 kV the drift region resistance $R_{drift}$ dominates $R_{on}$ the reduction of the latter is essential in commercially more relevant voltage classes (≤1.7 kV)—used for electric and hybrid electric vehicles (EVs/HEVs), photovoltaic inverters and power supplies—in order to significantly reduce the on-state power loss and switching losses. Here $R_{on}$ is still considerably higher than ideal as shown in FIG. 1. In this respect, low inversion channel mobility and, moreover, gate oxide stability represent two main challenges related to SiC MOS interfaces that might have significant impact on device cost and hence wide spread adoption of SiC power MOSFETs. Both issues are closely connected to defects near the $SiO_2$/SiC interface, since the SiC oxidation process produces kinetically stable defects at and near the SiC-oxide interface. Consequently, severe trapping and scattering of inversion layer electrons at this defective $SiO_2$/4H-SiC channel interface results in low mobility and was the main shortcoming of power MOSFETs in the 90s. Methods to overcome these obstacles such as well-known (Si CMOS) post metallization anneals using hydrogen ($H_2$) do not reduce these interface traps/defects resulting in higher than ideal on-state resistance SiC devices (see FIG. 1). In the late 90s, the introduction of nitric oxide (NO) post-oxidation for 6H-SiC and its application to 4H-SiC MOSFETs in 2001 enabled an enormous increase in inversion layer electron mobility, because the introduction of N near the interface via NO annealing reduces the interface defect density $D_{it}$. These results depict a huge breakthrough for reducing channel resistance and were one of the most important milestones in the development and commercialization of SiC power MOSFETs. However, there is a strong demand for higher mobility devices beyond state-of-the-art NO annealed MOSFETs particularly in order to expand SiC MOSFETs into the low/medium voltage classes markets.

Furthermore, problems that can be avoided by higher channel mobility in addition to reach ideal/lower $R_{ON}$ are as follows:
- the gate can be driven at lower voltages resulting in smaller oxide fields, which improves threshold stability and oxide long term reliability,
- aggressive scaling of the transistor channel length is not required in order to reduce the channel resistance, thus, short channel effects can be avoided.

Alternative strategies to reduce interface defects beyond the NO treatment are the introduction of interfacial layers with trace impurities, surface counter-doping, higher temperature oxidations and alternative non-polar crystal faces (instead of conventional polar Si-face) due to their inherently high mobility.

In the case of SiC, near interface traps (NITs) are an important class of interface defects, which can be found inside the oxide very close to the interface in Si and SiC MOS structures. For the latter they are responsible for the high concentration of neutral defect states near the conduction band edge (EC–ET<0.2 eV) as presented in FIG. 2. However, the distribution and density of NITs strongly depend on the polytype of SiC: whereas their density nearly exponentially increases toward the conduction band edge for α-SiC, e.g. 4H-SiC(0001) or 6H-SiC(0001), it remains relatively low for 3C-SiC(111). In addition, defect states in the lower half of the band gap (close to the valence band, see FIG. 2) are donor-like and do not directly affect the n-channel mobility. Defect states near the conduction band, however, are acceptor-like and can be negatively charged, for instance if a gate voltage is applied. As a consequence, electrons in the inversion channel are trapped, become almost immobile and act as Coulomb scattering centres, which significantly limits the n-channel mobility. Therefore, 3C-SiC/oxide interfaces in power MOSFET devices exhibit lower Da and as a consequence higher channel mobility (>160 cm$^2$/Vs) compared to their 4H-SiC/oxide counterparts.

A vertical silicon carbide power MOSFET (Metal-Oxide Semiconductor Field-Effect Transistor) according to the present invention comprises a 4H-SiC substrate of n+-type as drain, a 4H-SiC epilayer of n--type, epitaxially grown on the 4H-SiC substrate acting as drift region, a source region of p++-type, a well region of p-type, a channel region of p-type and a contact region of n++-type implanted into the drift region, a metal gate insulated from the source and the drift region by a gate-oxide, and a high mobility layer formed of an epitaxial 3C-SiC at the interface between the 4H-SiC epilayer and the gate-oxide, wherein the vertical thickness of the high mobility layer is in a range of 0.1 nm to 50 nm exemplarily in the range of 0.5 nm to 10 nm.

In a specific embodiment of the vertical silicon carbide power MOSFET according to the present invention, the 4H-SiC substrate (7) is {0001} oriented and the 4H-SiC epilayer (6) is {0001} oriented.

In another specific embodiment of the vertical silicon carbide power MOSFET according to the present invention, the high mobility layer (10) is in-situ doped with dopants of n-type.

In another specific embodiment of the vertical silicon carbide power MOSFET according to the present invention, the carriers of the vertical silicon carbide power MOSFET are transported in the 4H-SiC epilayer (6) of n$^-$-type but not in the high mobility layer.

In another embodiment of the present invention, a vertical silicon carbide power Insulated Gate Bipolar Transistor (IGBT) is provided, comprising a 4H-SiC substrate of n-type as field stop layer, a 4H-SiC epilayer of n$^-$-type, epitaxially grown on the 4H-SiC substrate acting as drift region, an emitter region of p$^{++}$-type, a well region of p-type, a channel region of p-type and a contact region of n$^{++}$-type implanted into the drift region, a metal gate insulated from the emitter and the drift region by a gate-oxide, a collector layer of p$^{++}$-type on the field stop layer face to face with the drift region, and a high mobility layer formed of an epitaxial 3C-SiC at the interface between the 4H-SiC epilayer and the gate-oxide, wherein the vertical thickness of the high mobility layer (10) is in a range of 0.1 nm to 50 nm exemplarily in the range of 0.5 nm to 10 nm.

An embodiment of a method of manufacturing a vertical silicon carbide power MOSFET according to the present invention, comprises steps of providing a 4H-SiC substrate of n+-type; epitaxially growing a 4H-SiC epilayer of n--type on the 4H-SiC substrate acting as drift region, implanting a source region of p++-type and a well region of p-type and a channel region of p-type and a contact region of n++-type into the drift region, epitaxially growing a high mobility layer of 3C-SiC on top of the implanted wafer surface using one of chemical vapor deposition (CVD) or metallo-organic chemical vapor deposition (MOCVD) or molecular beam epitaxie (MBE), wherein the vertical thickness of the high mobility layer is in a range of 0.1 to 50 nm; partially oxidizing the high mobility layer; performing an etch process for forming a metal gate, depositing a gate insulation as a gate oxide, forming the metal gate on the gate oxide and forming an ohmic contact for contacting the source region.

An embodiment of a method of manufacturing a vertical silicon carbide power Insulated Gate Bipolar Transistor (IGBT) comprises providing a 4H-SiC substrate of n-type as field stop layer, epitaxially growing a 4H-SiC epilayer of n--type on the 4H-SiC substrate acting as a drift region, depositing a collector layer of p+-type on the field stop layer face to face with the drift region, implanting an emitter region of p++-type and a well region of p-type and a channel region of p-type and a contact region of n++-type into the drift region, epitaxially growing a high mobility layer of 3C-SiC on top of the implanted wafer surface using one of chemical vapor deposition (CVD) or metallo-organic chemical vapor deposition (MOCVD) or molecular beam epitaxie (MBE), wherein the vertical thickness of the high mobility layer is in a range of 0.1 to 50 nm, partially oxidizing the high mobility layer, performing an etch process for forming a metal gate, depositing a gate insulation as a gate-oxide, forming the metal gate on the gate-oxide and forming an ohmic contact for contacting the emitter region.

DESCRIPTION OF EMBODIMENTS OF THE INVENTION

Figure 1:
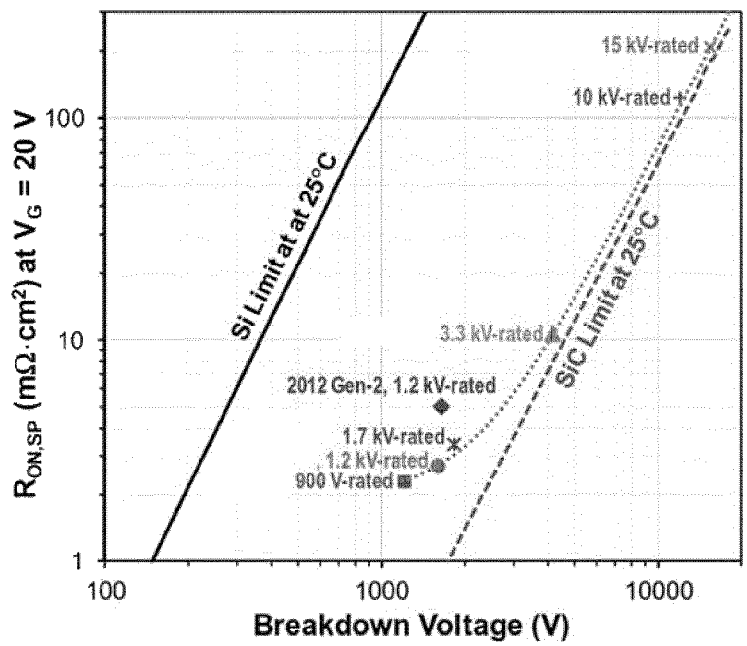
FIG. 1 shows the performance of a state-of-the-art 4H-SiC power MOSFET
Figure 2:
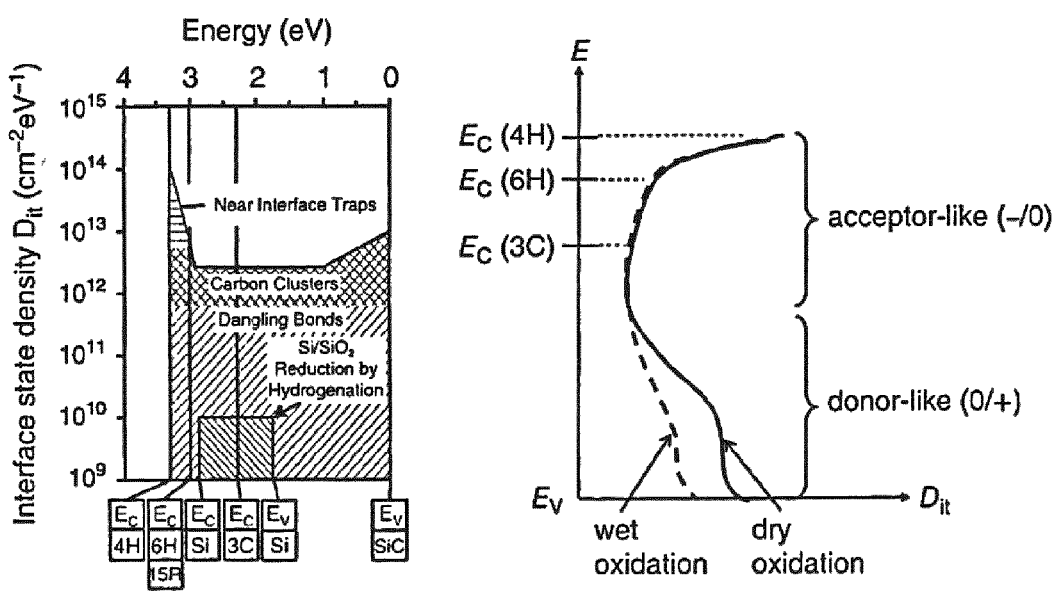
FIG. 2 shows a schematic distribution of interface states inside the band gap of various SiC polytypes

FIGS. 3A-3F shows a schematic of the process integration of a gate stack in a silicon carbide power MOSFET 1 according to the present invention.

In a silicon carbide power MOSFET 1 according to an exemplary embodiment of the present invention, a source region 2 of $p^{++}$-type, a well region 3 of p-type, a channel region 4 of p-type and a contact region 5 of $n^{++}$-type is implanted into a 4H-SiC epilayer 6 of $n^-$ type acting as drift region and which is epitaxially grown on a 4H-SiC substrate 7. Furthermore there is provided a metal gate 8 insulated from the source and drift region by a gate-oxide 9.

"implanted" in this context means a process by which e.g. ions of one element are accelerated into a solid target, thereby changing the physical, chemical, or electrical properties of the target. Ion implantation is used e.g. in semiconductor device fabrication. The ions can alter the elemental composition of the target (if the ions differ in composition from the target) if they stop and remain in the target. Due to the difference between the target material and the ions (dopants), the area treated with an implanting process can be analysed by various microscopy methods as e.g. Transmission electron microscopy (TEM), Focused Ion Beam (FIB), microwave detected photoconductivity (MDP) or microwave detected photo induced current transient spectroscopy (MD-PICTS).

"epitaxially grown" in this context means a deposition of a crystalline overlayer on a crystalline substrate. The overlayer is called an epitaxial film or epitaxial layer (epilayer). The crystals of the epilayer have a well-defined orientation relationship with respect to the substrate crystal structure (single-domain epitaxy). Epitaxial films may be grown from gaseous or liquid precursors. Because the substrate acts as a seed crystal, the deposited film may lock into one or more crystallographic orientations with respect to the substrate crystal. Because the epitaxial layer is grown starting from seeds, the interface between the substrate and the epitaxial layer can be visualized e.g. by Transmission electron microscopy (TEM).

In an exemplary embodiment, the 4H-SiC epilayer 6 is a {0001} oriented 4H-SiC epilayer 6 epitaxially grown on a {0001} oriented 4H-SiC substrate 7.

A high mobility layer 10 is grown at the interface 11 between the {0001} oriented 4H-SiC epilayer 6 and the gate-oxide 9.

Any high mobility channels exhibiting a low interface defect density $D_{it}$ with $SiO_2$ compared to the 4H-SiC/$SiO_2$ interface such as GaAs, In(Ga)P, In(Ga)As, In(Ga)Sb, AlN, III-V, GaN, SiGe, Si, Ge, GeSn, SiGeSn, 3C-SiC or other SiC polytypes might be used. According to the present invention the high mobility layer 10 is formed of an epitaxial 3C-SiC. The vertical thickness of the high mobility layer 10 is in a range of 0.1 nm to 50 nm, in an exemplary embodiment in the range of 0.5 nm to 10 nm. As already mentioned above, defects near the $SiO_2$/SiC interface, deteriorate the mobility of charge carriers since the SiC oxidation process produces kinetically stable defects at and near the SiC-oxide interface which cause e.g. severe trapping and scattering of inversion layer electrons at the $SiO_2$/4H-SiC. Due to the high mobility layer at the interface, the carrier mobility in the 4H-SiC comes close to the bulk mobility of SiC. A layer (high mobility layer) between the Oxide and the SiC, reducing e.g. the number of such kinetically stable defects at and near the SiC-oxide interface therefore improves the mobility of charge carriers and as a result thereof lowers the $R_{ON}$ so that e.g. the gate can be driven at lower voltages resulting in smaller oxide fields, which improves threshold stability and oxide long term reliability and an aggressive scaling of the transistor channel length is no longer required in order to reduce the channel resistance, thus, short channel effects can be avoided.

Figure 3B:
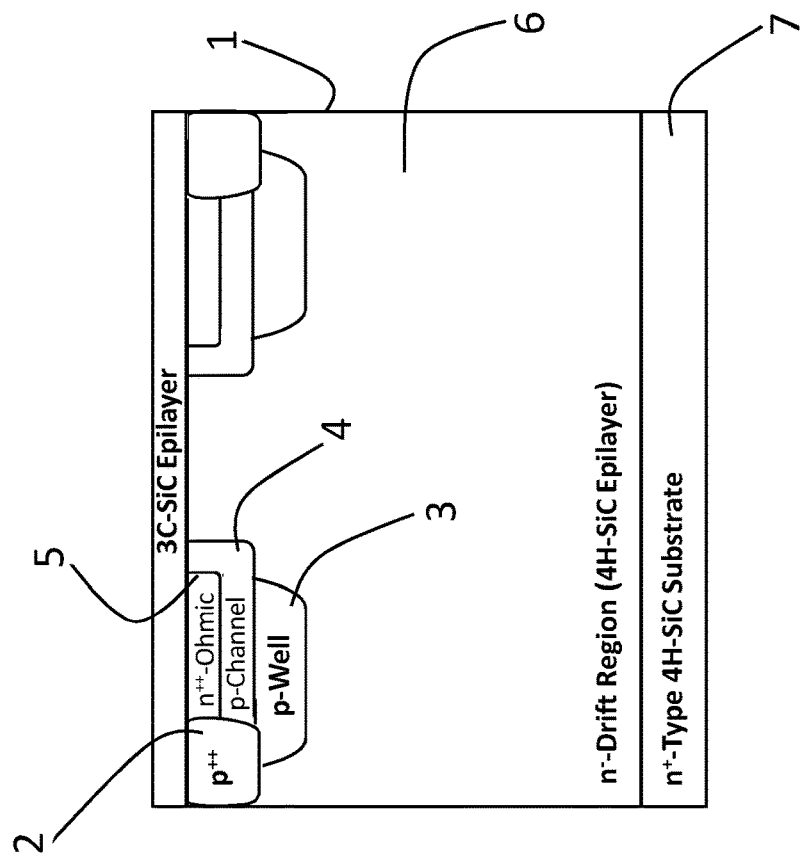
FIGS. 3A-3F show a schematic of the process integration of a gate stack according to the present invention
Figure 3A:
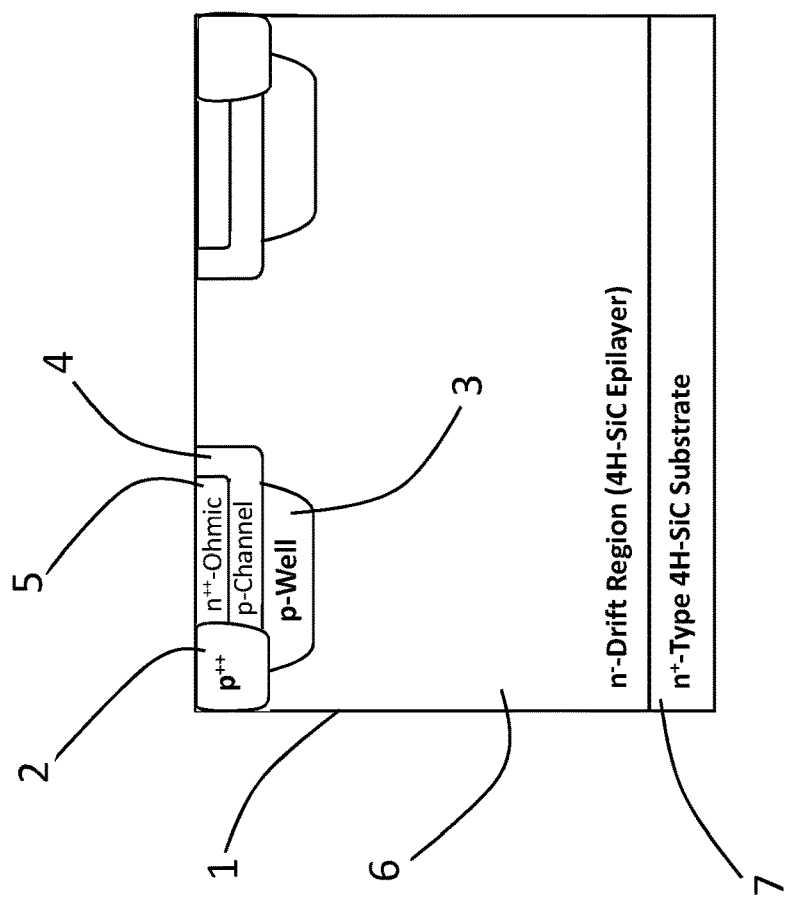
Figure 3D:
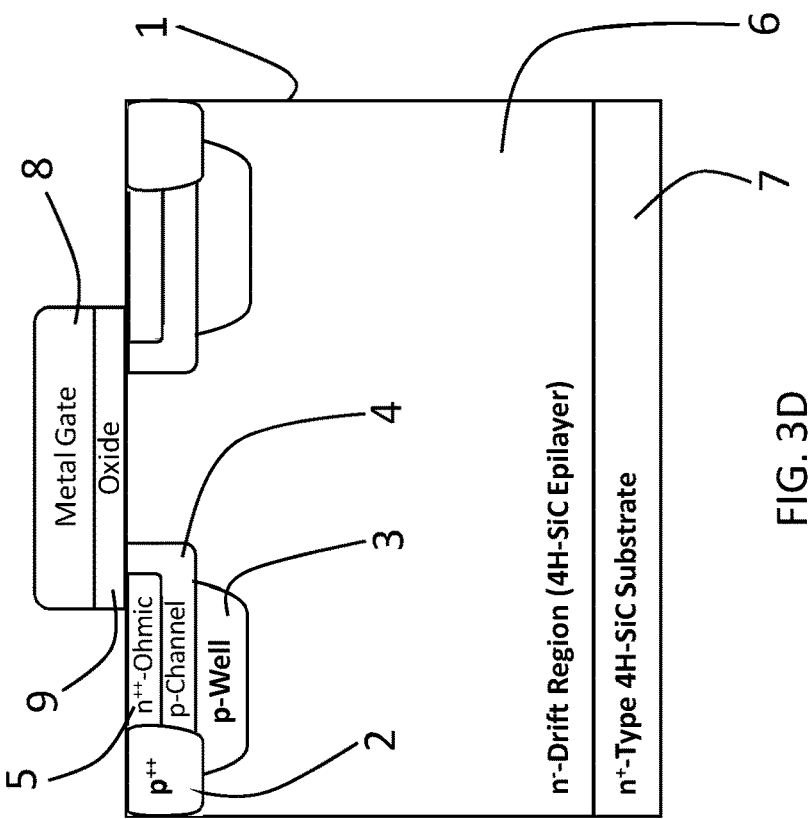
Figure 3C:
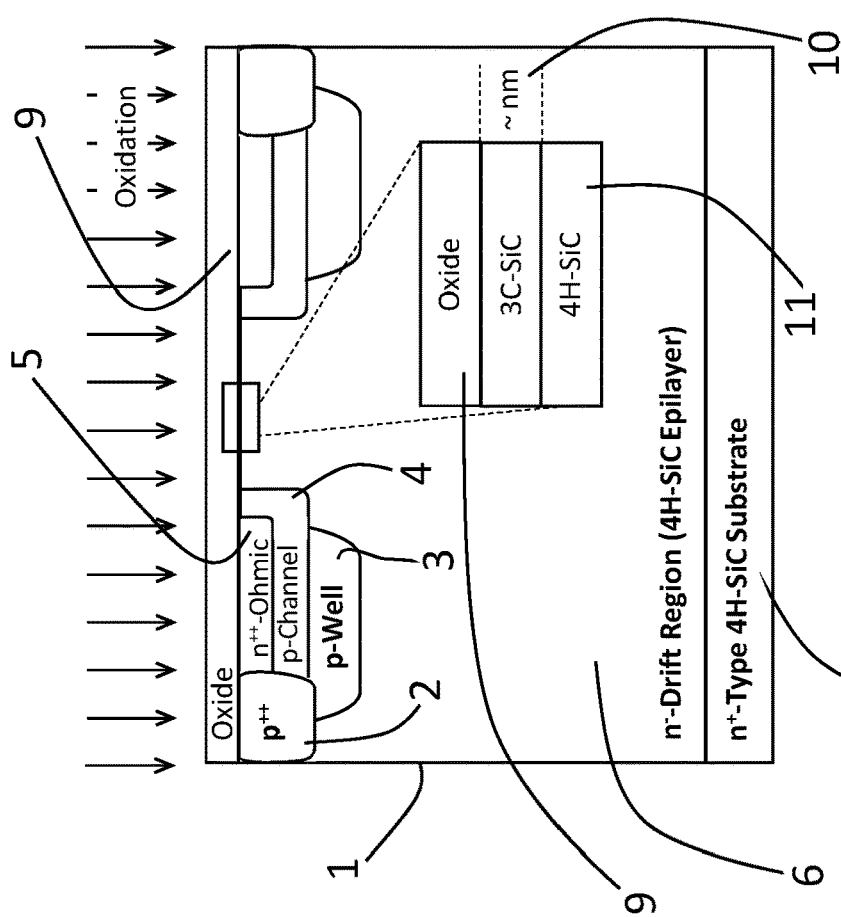
Figure 3F:
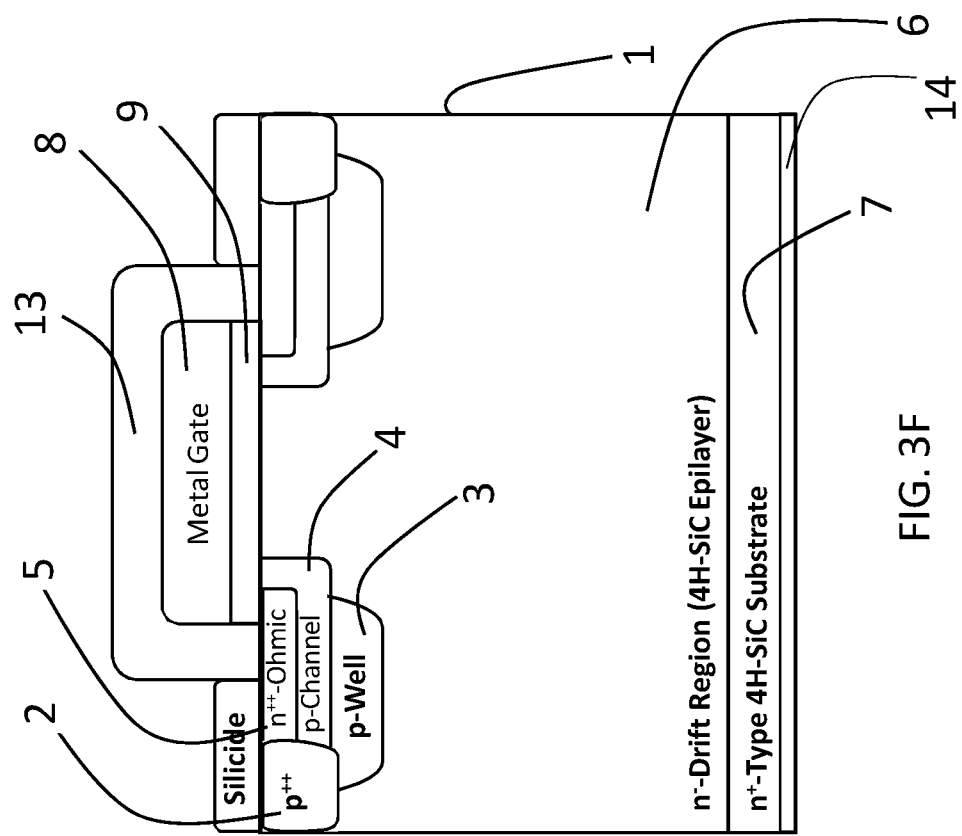
Figure 3E:
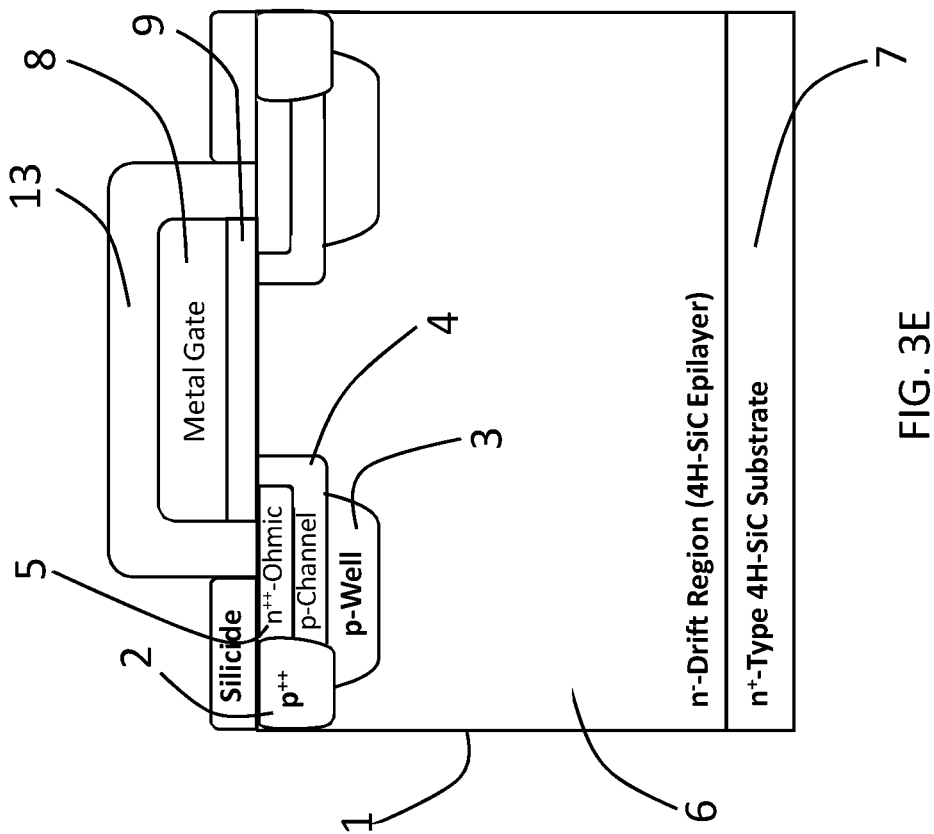

According to the present invention, it is proposed to combine 3C-SiC and 4H-SiC epilayers grown on 4H-SiC (0001) substrates to improve the carrier mobility in the channel of SiC power MOSFETs. This 3C-SiC/4H-SiC heterostructure benefits from the strengths of both polytypes, i.e. the advanced growth technology as well as the large band gap of 4H-SiC and the high quality 3C-SiC/oxide interface in terms of interface defects. A schematic of the process integration of this exemplary embodiment of a SiC heterostructure power MOSFET is presented in FIGS. 3A-3F. An n--4H-SiC epilayer 6 is grown on top of an n+-4H-SiC(0001) substrate 7 and acts as drift region material. After the standard implantation steps such as p-channel 4, p-well 3 and n++ ohmic contact 5 have been completed (FIG. 3A) a thin 3C-SiC layer 10 is epitaxially grown as high mobility layer 10 on top of the implanted wafer surface using chemical vapor deposition (CVD) techniques. Subsequently, this layer is partially oxidized in order to fabricate a 3C-SiC/gate oxide interface (FIGS. 3B and 3C). It is possible to partially or completely oxidize the grown 3C-SiC layer 10. Due to the small lattice mismatch between 3C-SiC and 4H-SiC-in-plane lattice mismatch amounts to approx. 0.08%—and the possibility to apply high growth temperatures, heteroepitaxial growth techniques have been developed in order to grow a high quality 3C-SiC epilayer 10 on 4H-SiC ensuring low-defective layers and interfaces, i.e. 3C-SiC/4H-SiC. The device fabrication is finalized with metal gate etch, insulation 13 and ohmic contact 14 formation (see FIG. 3D-F).

Some advantages of this channel passivation and oxidation technique are:

1. make use of the advanced technology advantages (e.g. epitaxial growth, device processing) and electronic properties (e.g. band gap) of 4H-SiC for the inversion channel,
2. the low interface defect density of the 3C-SiC/oxide interface results in less carrier scattering, thus, enhanced inversion layer electron mobility,
3. higher electron mobility enables lower Ron of SiC power MOSFETs, which is essential to reduce on-state power loss and switching losses especially for commercially highly relevant voltage classes (≤1.7 kV),
4. the grown 3C-SiC layer can be in-situ doped, i.e. using n-type dopants such as nitrogen (N), which might help reducing the $D_{it}$ by forming an interfacial counter doping layer.

Contrary to prior art silicon carbide power MOSFETs and as it is evident e.g. from FIG. 3C, the interface with the 3C-SiC only has a thickness in the range of nm and is not located in the channel. The carrier transport in the device according to the present invention remains in the 4H-SiC. Due to the high mobility layer at the interface, the carrier mobility in the 4H-SiC comes close to the bulk mobility of SiC.

Figure 4:
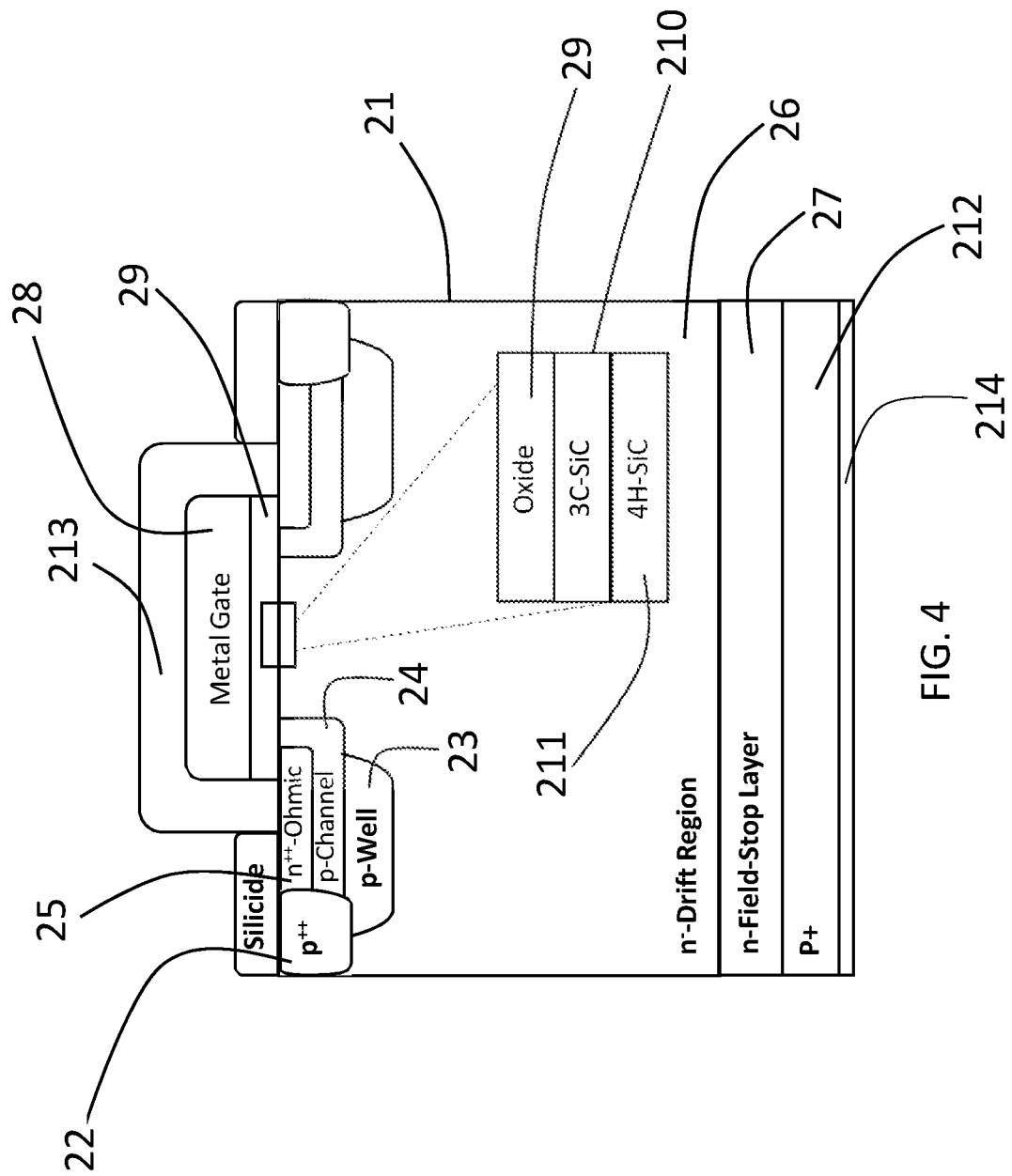
FIG. 4 shows a schematic of a SiC IGBT according to the present invention

Instead of a power MOSFET, the inventive concept of a high mobility layer also can be applied on a MOS gated JFET or e.g. an Insulated Gate Bipolar Transistor (IGBT) as it disclosed e.g. in FIG. 4.

A method of manufacturing a vertical silicon carbide power MOSFET, according to the present invention is a method of: providing a {0001} oriented 4H-SiC substrate of $n^+$-type; epitaxially growing a {0001} oriented 4H-SiC epilayer of $n^-$-type on the 4H-SiC substrate acting as drift region and implanting a source region of $p^{++}$-type and a well region of p-type and a channel region of p-type and a contact region of $n^{++}$-type into the drift region and epitaxially growing a high mobility layer of 3C-SiC on top of the implanted wafer surface using any method providing a good layer quality and therefore with only a small number of defects, like e.g. chemical vapor deposition or metallo-organic chemical vapor deposition (MOCVD) or molecular beam epitaxie (MBE), wherein the vertical thickness of the high mobility layer is in a range of 0.1 nm to 50 nm and partially oxidizing the high mobility layer and performing an etch process for forming a metal gate and depositing a gate insulation and forming the metal gate on the gate-oxide and forming an ohmic contact to contact the source region.

With this method, e.g. a vertical silicon carbide power MOSFET according to the present invention having enhanced inversion layer electron mobility and reduced on-state power loss and switching losses especially for commercially highly relevant voltage classes as described above is readily obtained.

Although the present invention has been described in relation to a particular embodiment, many other design variations and modifications will be apparent for those skilled in the art.

The invention claimed is:

1. A vertical silicon carbide power MOSFET, comprising:
   a drain formed by a 4H-SiC substrate with n+ type doping;
   a drift region comprising a 4H-SiC epilayer with n− type doping, the 4H-SiC epilayer being epitaxially grown on the 4H-SiC substrate;
   a source region with p++ type doping disposed in the drift region;
   a well region with p type doping disposed into the drift region;
   a channel region with p type doping disposed into the drift region;
   a contact region with n++ type doping disposed into the drift region;
   a metal gate insulated from the source region and the drift region by a gate-oxide; and
   a high mobility layer comprising a 3C-SiC epilayer, the high mobility layer located at an interface between the 4H-SiC epilayer and the gate-oxide and having a vertical thickness between 0.1 nm to 50 nm.

2. The vertical silicon carbide power MOSFET according to claim 1, wherein the 4H-SiC substrate is a {001} oriented 4H-SiC substrate.

3. The vertical silicon carbide power MOSFET according to claim 1, wherein the 4H-SiC epilayer is a {001} oriented 4H-SiC epilayer.

4. The vertical silicon carbide power MOSFET according to claim 1, wherein the 4H-SiC substrate is a {001} oriented 4H-SiC substrate and the 4H-SiC epilayer is a {001} oriented 4H-SiC epilayer.

5. The vertical silicon carbide power MOSFET according to claim 1, wherein the high mobility layer is an n type doped layer.

6. The vertical silicon carbide power MOSFET according to claim 1, wherein the vertical thickness of the high mobility layer is in a range of 0.5 nm to 10 nm.

7. A method of operating the vertical silicon carbide power MOSFET according to claim 1, the method comprising applying a voltage to the metal gate to cause carriers of the vertical silicon carbide power MOSFET to be transported in the drift region but not in the high mobility layer.

8. A vertical silicon carbide power Insulated Gate Bipolar Transistor (IGBT), comprising:
   a field stop layer formed by a 4H-SiC substrate with n type doping;
   a drift region comprising a 4H-SiC epilayer of n-type, 4H-SiC epilayer having been epitaxially grown the 4H-SiC substrate;
   an emitter region of p++ type doping disposed in the drift region;
   a well region of p-type doping disposed in the drift region;
   a channel region of p-type doping disposed in the drift region;
   a contact region with n++ type doping disposed in the drift region;
   a metal gate insulated from the emitter region and the drift region by a gate-oxide;
   a collector layer of p+ type doping disposed on a surface of the field stop layer, the field stop layer disposed between the drift region and the collector layer; and
   a high mobility layer comprising a 3C-Si epilayer located at an interface between the 4H-SiC epilayer and the gate-oxide, wherein the high mobility layer having a vertical thickness between 0.1 nm to 50 nm.

9. The vertical silicon carbide power IGBT according claim 8, wherein the 4H-SiC substrate is a {001} oriented 4H-SiC substrate and the 4H-SiC epilayer is a {001} oriented 4H-SiC epilayer.

10. The vertical silicon carbide power IGBT according claim 8, wherein the high mobility layer is an n type doped layer.

11. The vertical silicon carbide power IGBT according claim 8, wherein the vertical thickness of the high mobility layer is between 0.5 nm to 10 nm.

12. A method of forming a semiconductor device, the method comprising:
   epitaxially growing a 4H-SiC epilayer on a 4H-SiC substrate, the 4H-SiC epilayer having n type doping and the 4H-SiC substrate having n type doping;
   implanting a first region of p++ type, a second region of p type, a third region of p type and a fourth region of n++ type in a surface of the 4H-SiC epilayer;
   epitaxially growing a 3C-SiC layer on the implanted surface of the 4H-SiC epilayer, wherein the 3C-SiC layer is grown to a vertical thickness of 0.1 to 50 nm;
   partially oxidizing the 3C-SiC layer;
   depositing an insulation layer over the partially oxidized 3C-SiC layer; and
   forming a metal region on the insulation layer.

13. The method according to claim 12, wherein epitaxially growing the 3C-SiC layer comprises performing a chemical vapor deposition (CVD) process.

14. The method according to claim 12, wherein epitaxially growing the 3C-SiC layer comprises performing metal-organic chemical vapor deposition (MOCVD) process.

15. The method according to claim 12, wherein epitaxially growing the 3C-SiC layer comprises performing a molecular beam epitaxy (MBE) process.

16. The method according to claim 12, wherein forming the semiconductor device comprises forming a vertical silicon carbide power MOSFET;
   wherein the 4H-SiC substrate has n+ type doping and forms a drain layer;

wherein the 4H-SiC epilayer forms a drift region;
wherein the first region forms a source region;
wherein the second region forms a well region;
wherein the third region forms a channel region;
wherein the fourth region forms a contact region;
wherein the 3C-SiC layer forms a high mobility layer;
wherein the insulation layer forms a gate-oxide; and
wherein the metal region forms a gate region.

17. The method according to claim 16, further comprising forming an ohmic contact for contacting the source region.

18. The method according to claim 12, wherein the 4H-SiC epilayer is grown on a first surface of the 4H-SiC substrate, the method further comprising forming a p+ type doped semiconductor layer on a second surface of the 4H-SiC substrate, the second surface opposite the first surface.

19. The method according to claim 18, wherein forming the semiconductor device comprises forming a vertical silicon carbide power Insulated Gate Bipolar Transistor (IGBT);
wherein the 4H-SiC substrate forms a field stop layer;
wherein the 4H-SiC epilayer forms a drift region;
wherein the p+ type doped semiconductor layer forms a collector layer;
wherein the first region forms an emitter region;
wherein the second region forms a well region;
wherein the third region forms a channel region;
wherein the fourth region forms a contact region;
wherein the 3C-SiC layer forms a high mobility layer;
wherein the insulation layer forms a gate-oxide; and
wherein the metal region forms a gate region.

20. The method according to claim 19, further comprising forming an ohmic contact for contacting the emitter region.

\* \* \* \* \*